United States Patent [19]
Ohta

[11] Patent Number: 5,557,123
[45] Date of Patent: Sep. 17, 1996

[54] NONVOLATILE SEMICONDUCTOR MEMORY DEVICE WITH SHAPED FLOATING GATE

[75] Inventor: Noriyuki Ohta, Tokyo, Japan

[73] Assignee: NEC Corporation, Tokyo, Japan

[21] Appl. No.: 319,605

[22] Filed: Oct. 7, 1994

[30] Foreign Application Priority Data

Oct. 8, 1993 [JP] Japan .................................... 5-253011

[51] Int. Cl.$^6$ ......................... H01L 29/788; G11C 11/34
[52] U.S. Cl. ......................... 257/315; 257/321; 257/322; 365/185.01
[58] Field of Search ..................................... 257/315, 316, 257/321, 322; 365/185

[56] References Cited

U.S. PATENT DOCUMENTS 5,338,957  8/1994  Fukumoto ............................... 257/316

FOREIGN PATENT DOCUMENTS

56-36166  4/1981  Japan ..................................... 257/315
56-40505  9/1981  Japan .

Primary Examiner—Jerome Jackson, Jr.
Attorney, Agent, or Firm—Sughrue, Mion, Zinn, Macpeak & Seas

[57] ABSTRACT

A nonvolatile semiconductor memory device with improved writing characteristics. The memory device has memory cell transistors arranged in rows and columns. The memory cell transistors belonging to the same column share a source region and a drain region, and a channel region is disposed between the source and drain regions. The interval between the source and drain regions is the isolation width. Each of the memory cell transistors has a floating gate electrode disposed on the channel region with a first gate insulating film and a control gate electrode disposed on the floating gate electrode with a second gate insulating film. The floating gate electrode does not have a constant width and has a portion narrower than the isolation width which is free from the floating gate electrode. The narrower portion is typically formed as a constricted portion of the floating gate electrode.

14 Claims, 9 Drawing Sheets

LR > LW
WR > WW
LR = ELEMENT ISOLATION WIDTH

LR > LW
WR > WW
LR = ELEMENT ISOLATION WIDTH

NONVOLATILE SEMICONDUCTOR MEMORY DEVICE WITH SHAPED FLOATING GATE

BACKGROUND OF THE INVENTION

1. Field of the Invention

The present invention relates to a semiconductor memory device, and more particularly to a nonvolatile semiconductor memory device for use as an ultraviolet erasable programmable read-only memory (EPROM) or an electrically erasable programmable read-only memory (EEPROM).

2. Description of the Related Art

Nonvolatile semiconductor memory devices such as an EPROM and an EEPROM have an array of memory cells each including a floating gate electrode on a gate insulating film of a MOS transistor and a control gate electrode disposed on the floating gate electrode with a thin insulating layer interposed therebetween. Generally, those memory cells which belong to one column have drain and source regions formed as an integral structure, and those memory cells which belong to one row have control gate electrodes formed as an integral structure serving as a word line. Japanese patent publication No. 56-40505 (JP, B2, 56-40505), for example, discloses a typical programmable semiconductor memory device.

Figure 1:
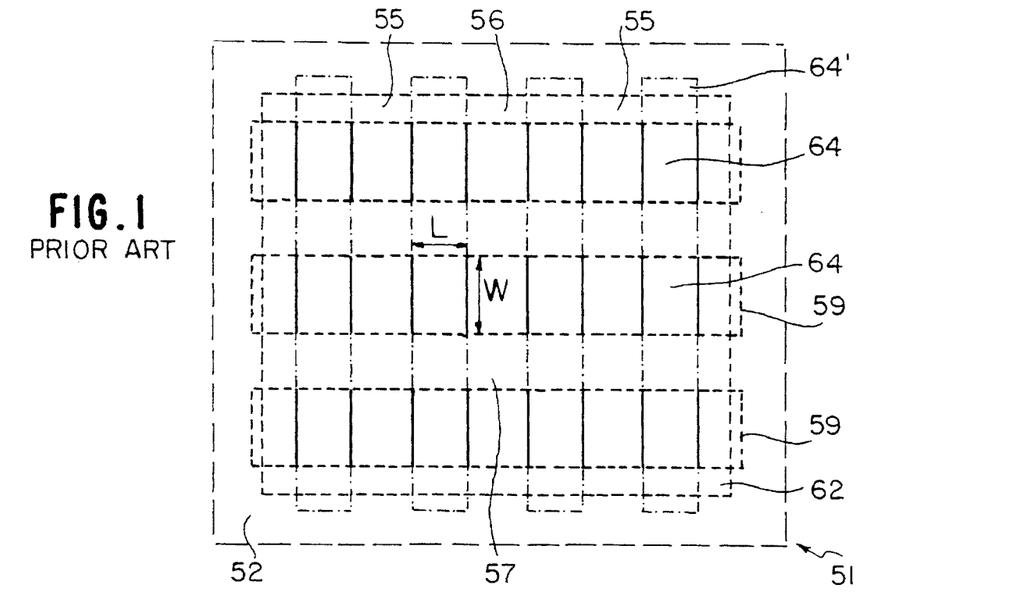
FIG. 1 is a schematic plan view of a conventional nonvolatile semiconductor memory device.

FIG. 1 schematically shows in plan a conventional semiconductor memory device.

As shown in FIG. 1, an element-isolating insulating film 52 is disposed on the surface of a semiconductor substrate 51 of silicon in surrounding relation to a memory cell region 62. The memory cell region 62 contains three rows and four columns of memory cells. Source regions 55 and drain regions 56 extend vertically in FIG. 1 and are alternately arranged horizontally at given intervals or isolation intervals L. Control gate electrodes 59 in the respective rows extend horizontally in FIG. 1, each of the control gate electrodes 59 having a width W. Floating gate electrodes 64 are disposed between the source and drain regions 55, 56 and below the respective control gate electrodes 59. Each of the floating gate electrodes 64 has a size W×L. In each of the memory cells, the channel length is equal to the isolation interval L, and the channel width is equal to the width W of the control gate electrodes 59. To isolate the source and drain regions 55, 56 completely from each other in areas where no control gate electrodes 59 are present, a first interlayer insulating film 57 is disposed which fills recesses between the floating gate electrodes 64.

To manufacture the conventional semiconductor memory device, a layer 64' which will serve as the floating gate electrodes is formed between the source regions 55 and the drain regions 56 so as to extend along columns across a plurality of memory cells. Then, a first interlayer insulating film 57 is formed, followed by the formation of control gate electrodes 59, whereupon the layer 64' is separated in self-alignment into floating gate electrodes 64 of the respective memory cells.

However, the conventional semiconductor memory device, described above, suffers the following problems because the width of the floating gate electrodes, i.e., the channel length of the memory cells, is equal to the element-isolation interval between the source and the drain:

(a) When data are to be written in a memory cell with channel hot electrons, a write current that is required to write tile data is large, resulting in a large power consumption. For example, a write current is 500 μA if the channel length L is 0.6 μm and the channel width W is 1.2 μm.

(b) Inasmuch as the channel length of a memory cell transistor is equal to the isolation interval, it is impossible to freely select only the channel length. For example, even if a length of 0.5 μm is optimum as the channel length of a memory cell transistor, since a current leakage occurs between adjacent source and drain regions across the length of 0.5 μm, this optimum length cannot be used as the channel length. As a result, a limitation is imposed on the selection of the channel length.

SUMMARY OF THE INVENTION

It is therefore an object of the present invention to provide a nonvolatile semiconductor memory device which has a low power requirement and allows the channel length of a memory cell transistor to be freely selected without impairing the element isolation capability between the source and the drain.

According to the present invention, the above object can be achieved by a nonvolatile semiconductor memory device comprising a plurality of memory cell transistors each comprising source and drain regions disposed on a surface of a semiconductor substrate of one conductivity type, a channel region disposed between the source and drain regions, a first gate insulating film covering the channel region, a floating gate electrode disposed on the first gate insulating film, a second gate insulating film covering the floating gate electrode, and a control gate electrode disposed on the second gate insulating film, at least two of the memory cell transistors sharing the same source and drain regions, each of the memory cell transistors having a channel length determined by a width of the floating gate electrode, the floating gate electrode having a portion narrower than an element-isolation interval at an area between the source and drain regions, and said area is free of the floating gate electrode.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

A nonvolatile semiconductor memory device according to a first embodiment of the present invention will be described first below. The nonvolatile semiconductor memory device according to the first embodiment is similar to the conventional nonvolatile semiconductor memory device shown in FIG. 1 except for the configuration of floating gate electrodes 4. The nonvolatile semiconductor memory device according to the first embodiment will be described below with reference to FIGS. 2 and 3A to 3D.

Figure 2:
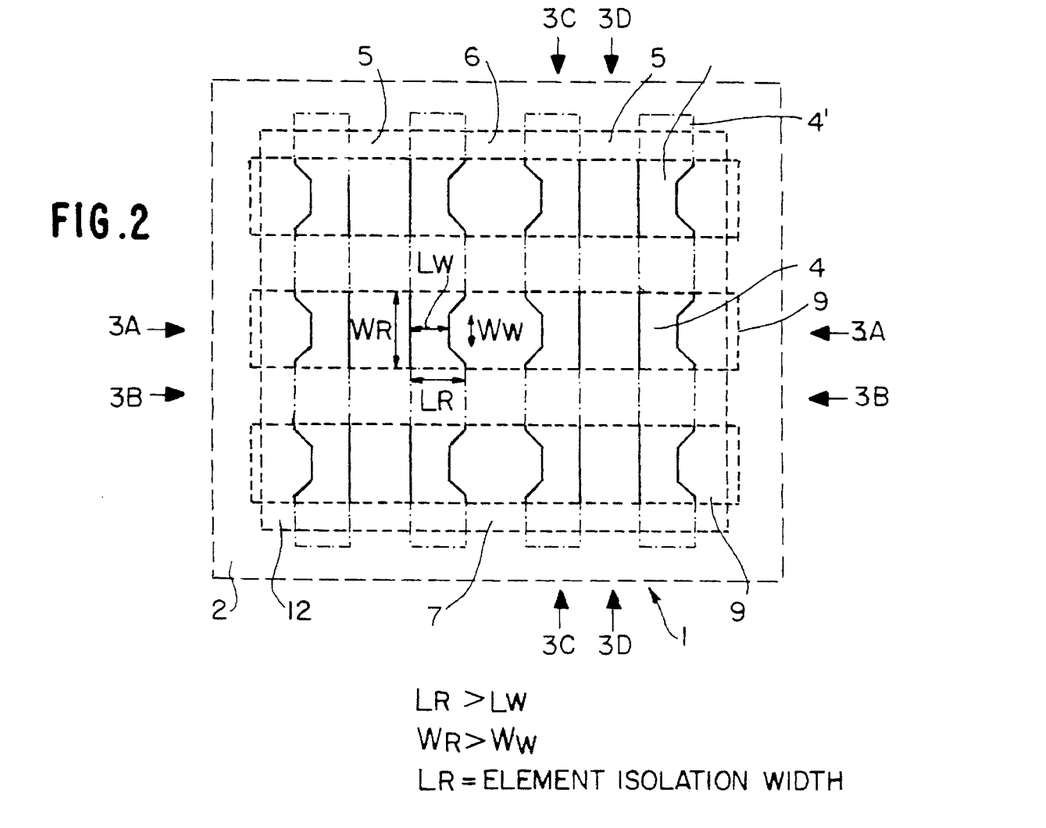
FIG. 2 is a schematic plan view of a nonvolatile semiconductor memory device according to a first embodiment of the present invention.
Figure 3A:
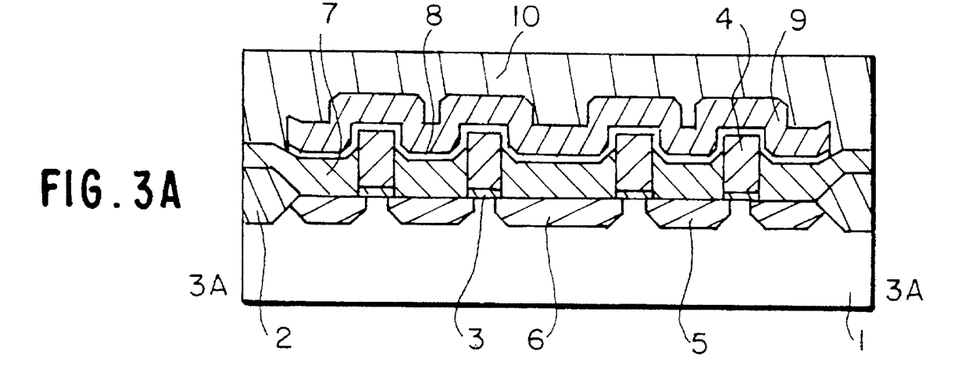
FIG. 3A is a cross-sectional view taken along line 3A—3A of FIG. 2.
Figure 3B:
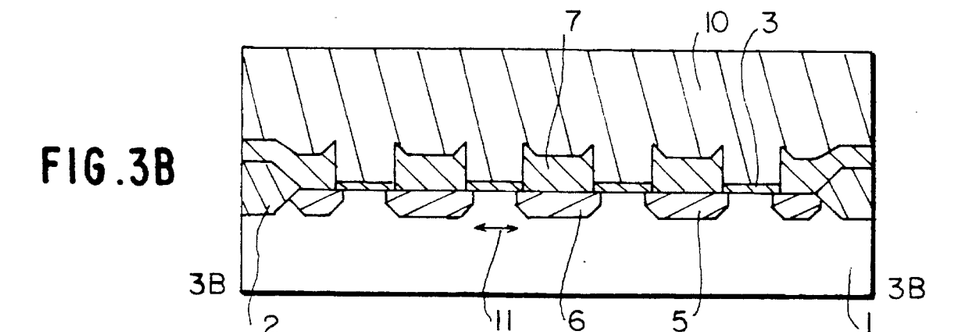
FIG. 3B is a cross-sectional view taken along line 3B—3B of FIG. 2.
Figure 3C:
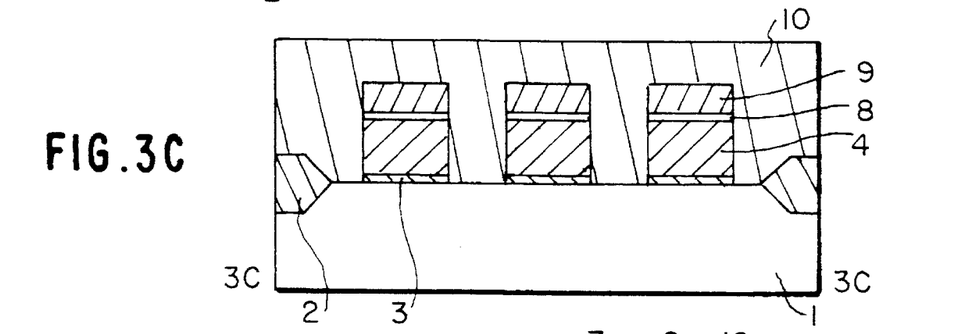
FIG. 3C is a cross-sectional view taken along line 3C—3C of FIG. 2.
Figure 3D:
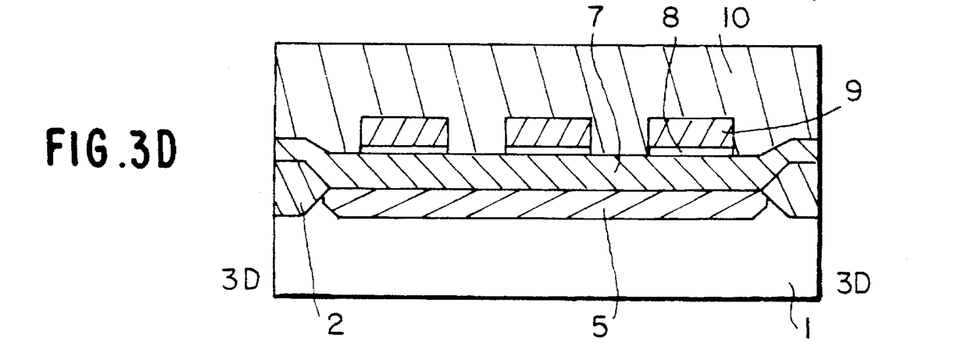
FIG. 3D is a cross-sectional view taken along line 3D—3D of FIG. 2.

As shown in FIG. 2, an square-shaped peripheral element-isolating insulating film 2 is disposed on the surface of a semiconductor substrate 1 in surrounding relation to a memory cell region 12. The memory cell region 12 contains an array of twelve memory cells in three rows and four columns. Source regions 5 and drain regions 6 extend vertically in FIG. 2 between two confronting sides of the memory cell region 12 and are alternately arranged horizontally at given intervals. The source regions 5 have a constant horizontal width, and the drain regions 6 have an increased width in areas below control gate electrodes 9 (described later on). Areas which are sandwiched between the source regions 5 and the drain regions 6 will become channel regions of the memory cells.

Control gate electrodes 9 extend horizontally in FIG. 2 between two confronting sides of the memory cell region 12, each of the control gate electrodes 9 having a width $W_R$. Floating gate electrodes 4, which correspond respectively to the memory cells, are disposed in those areas where the areas sandwiched between the source regions 5 and the drain regions 6 and the areas of the control gate electrodes 9 are superimposed on each other. The floating gate electrodes 4 are disposed on the channel regions formed on the surface of the semiconductor substrate 1 with a first gate insulating film 3 (see FIGS. 3A to 3C) interposed therebetween. A second gate insulating film 8 (see FIGS. 3A, 3C, and 3D) is interposed between the floating gate electrodes 4 and the control gate electrodes 9. Because the drain regions 6 have an increased width below the control gate electrodes 9, the floating gate electrodes 4 have a rectangular shape with one side constricted complimentarily. A first interlayer insulating film 7 (see FIGS. 3A, 3B, and 3D) is disposed in covering relation to the source regions 5 and the drain regions 6. A second interlayer insulating film 10 (see FIGS. 3A to 3D) is disposed in covering relation to the entire structure described above. Actually, the first gate insulating film 3 is formed on the entire surface of the areas which are sandwiched between the source regions 5 and the drain regions 6, and the second gate insulating film 8 is formed on the entire lower surface of the control gate electrodes 9, i.e., the surface which faces the semiconductor substrate 1.

In this nonvolatile semiconductor memory device, each of the floating gate electrodes 4 is not of a constant width. The areas sandwiched between the source regions 5 and the drain regions 6, which are free of the floating gate electrodes 4, serve as element-isolation regions 11. Each of the isolation regions 11 has a width, i.e., an isolation interval $L_R$. Each of the floating gate electrodes 4 has a width equal to the element-separating interval $L_R$ at its column-wise ends and a width $L_W$ smaller than the element-separating interval $L_R$ at its column-wise central portion. Each of the floating gate electrodes 4 has a column-wise length $W_R$, and the column-wise central portion of each of the floating gate electrodes 4 which has the width $L_W$ has a column-wise length $W_W$. The length $W_R$ is greater than the length $W_W$. As a result, each memory cell transistor has both portions which have channel lengths $L_R$, $L_W$, respectively.

In FIG. 2, a layer 4' which is not present in the completed nonvolatile semiconductor memory device is indicated by the dot-and-dash lines for illustrative purpose. The layer 4' is deposited to form the floating gate electrodes 4 in the fabrication process, but is thereafter removed except for those areas which will serve as the floating gate electrodes 4.

Figure 4:
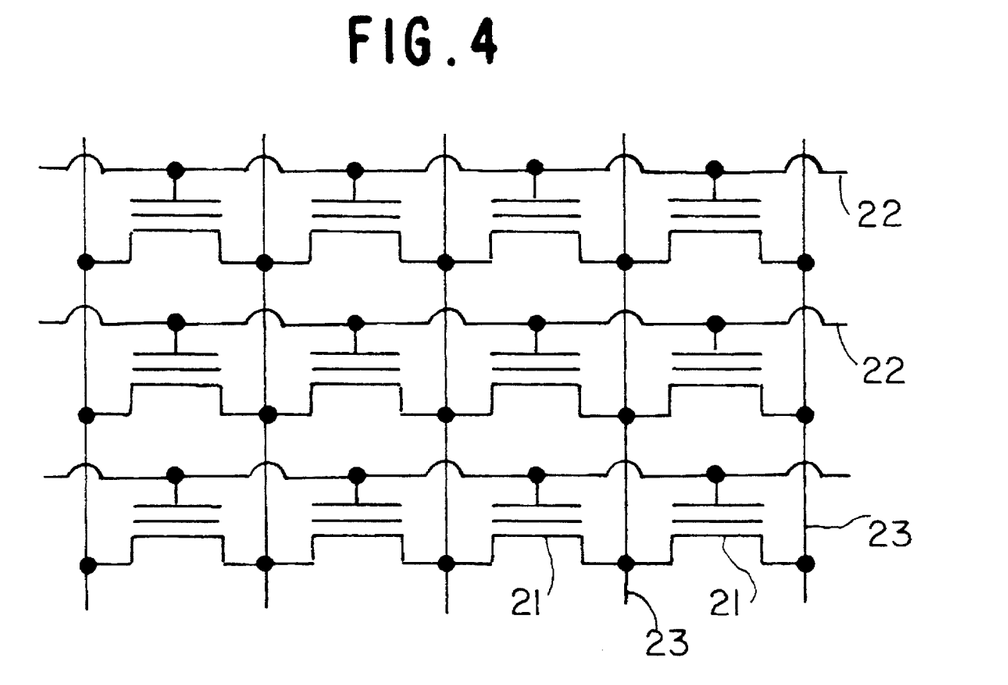
FIG. 4 is an equivalent circuit diagram of memory cells of the nonvolatile semiconductor memory device shown in FIG. 2.

FIG. 4 shows an equivalent circuit of the nonvolatile semiconductor memory device. As shown in FIG. 4, the nonvolatile semiconductor memory device has twelve memory cell transistors 21 arrayed in three rows and four columns. The nonvolatile semiconductor memory device also has word lines 22 associated with the respective rows and connected to the control gates of the memory cell transistors 21, respectively. The word lines 22 correspond to the control gate electrodes 9 shown in FIGS. 2 and 3A to 3D. Further, the nonvolatile semiconductor memory device has bit lines 23 associated with the respective columns and connected to the sources or drains of the memory cell transistors 21, respectively, the bit lines 23 corresponding to the source regions 5 or the drain regions 6 shown in FIGS. 2 and 3A to 3D.

Figure 5:
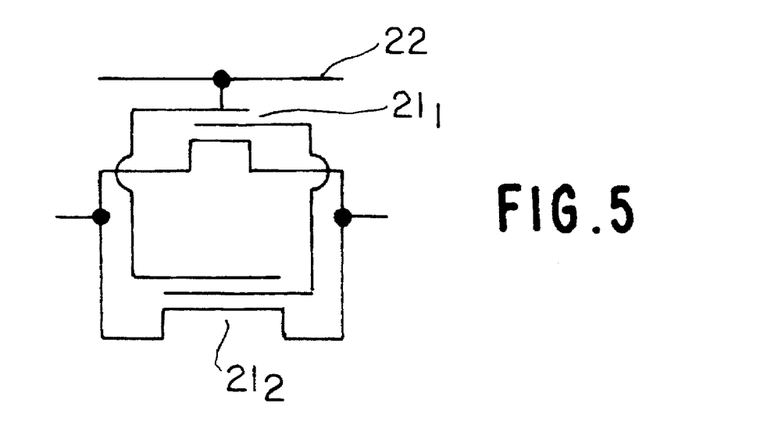
FIG. 5 is an equivalent circuit diagram of each memory cell transistor of the nonvolatile semiconductor memory device shown in FIG. 2.

FIG. 5 shows an equivalent circuit of each memory cell transistor of the nonvolatile semiconductor memory device. Since each memory cell transistor has both portions which have channel lengths $L_R$, $L_W$, respectively, the memory transistor may be regarded as two parallel-connected transistors $21_1$, $21_2$ having different channel lengths. The transistor $21_1$ shown in an upper side of FIG. 5 has a shorter channel length $L_W$, and the transistor $21_2$ shown in a lower side of FIG. 5 has a longer channel length $L_R$.

The nonvolatile semiconductor memory device with the memory cells thus constructed offers the following advantages:

A first advantage is that when data are to be written in a memory cell transistor with channel hot electrons, they are quickly written in the portion having the shorter channel length $L_W$, and since the channel width $W_W$ of the portion having the shorter channel length $L_W$ is relatively small, a write current required to write the data is relatively small, resulting in a reduced power requirement. For example, whereas each conventional memory cell transistor shown in FIG. 1 which has a channel length L of 0.6 μm and a channel width W of 1.2 μm requires a write current of 500 μA, the write current of the memory cell transistor according to the present embodiment is 350 µA, which is 70% of the conventional write current, insofar as $L_R$ is 0.8 µm, $W_R$ is 1.2 µm, $L_W$ is 0.6 µm, and $W_W$ is 0.8 µm.

According to a second advantage, a read current required to read stored data from the memory cell transistor is not reduced, allowing the data to be read stably. Since the read current depends upon the channel width of the memory cell, the read current is reduced if the channel width is reduced. However, because the channel width $W_R$ of the entire memory cell remains unchanged, the memory cell transistor according to the present embodiment maintains a read current as high as in the case with the conventional memory cell transistor.

A third advantage is that even if the channel length of the memory cell transistor is effectively reduced, the isolation characteristics between adjacent source and drain regions are not degraded. In the conventional nonvolatile semiconductor memory device, in order to reduce the channel length L of a memory cell transistor for improved writing characteristics, it is necessary to reduce the overall width of the floating gate electrodes. Since the isolation intervals are necessarily reduced when the overall width of the floating gate electrodes is reduced, any current leakage between adjacent source and drain regions is not negligible. According to the present embodiment, however, since the channel length $L_W$, which is largely responsible for the writing characteristics, can be selected separately from the isolation interval $L_R$, the isolation characteristics are not degraded even when the channel length $L_W$ is reduced for improving the writing characteristics of the memory cell transistor. In memory cell transistors of the type described above, it is generally possible to make the channel length shorter than the element-isolation interval because the electric field in the channel region can be controlled by the control gate electrode.

A process of fabricating the nonvolatile semiconductor memory device according to the present embodiment will be described below with reference to FIGS. 6A to 6J and 7A to 7J. The figures with the same suffix show the same step of the fabrication process. For example, FIGS. 6E and 7E show the same step of the fabrication process, and differ from each other in that FIG. 6E is a cross-sectional view corresponding to a cross section taken along line 3A—3A of FIG. 2 and FIG. 7E is a cross-sectional view corresponding to a cross section taken along line 3C—3C of FIG. 2.

Figures 6A, 6B:
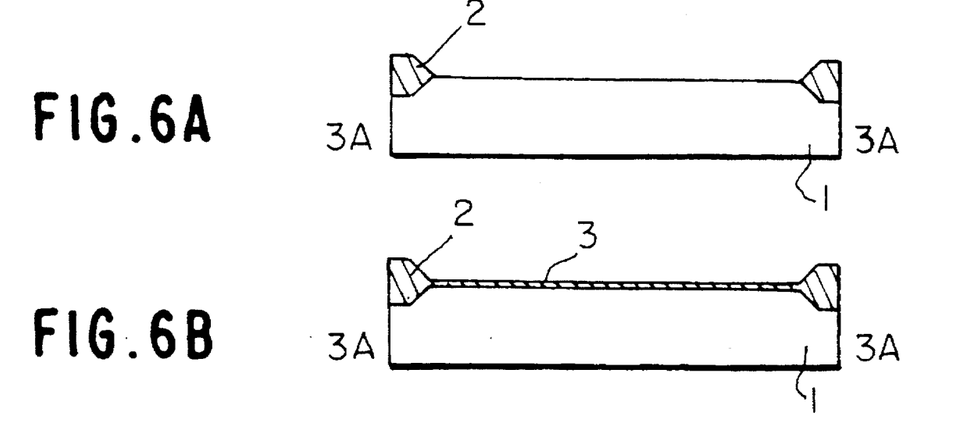
FIGS. 6A to 6J are cross-sectional views showing successive steps of fabricating the nonvolatile semiconductor memory device shown in FIG. 2, the views corresponding to the cross section taken along line 3A—3A of FIG. 2.
Figure 6C:
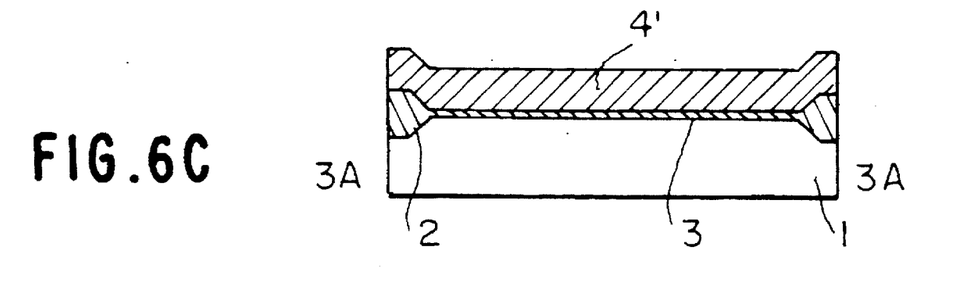
Figure 6D:
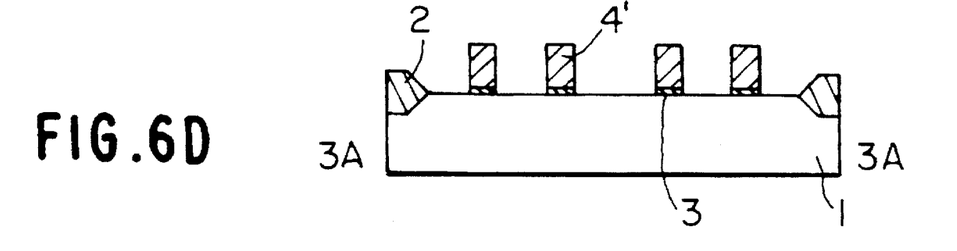
Figure 7A:
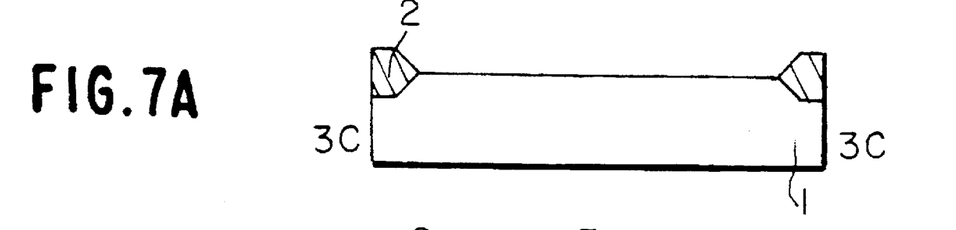
FIGS. 7A to 7J are cross-sectional views showing successive steps of fabricating the nonvolatile semiconductor memory device shown in FIG. 2, the views corresponding to the cross section taken along line 3C—3C of FIG. 2.
Figure 7B:
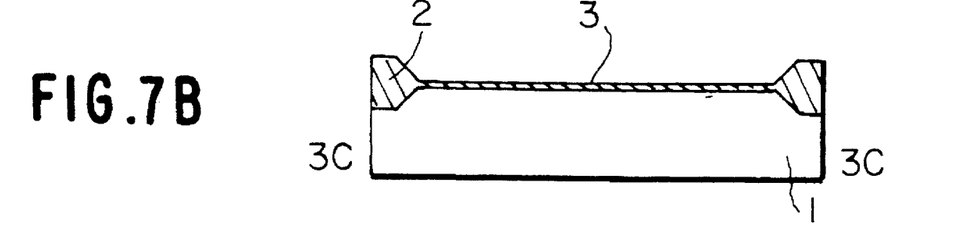
Figure 7C:
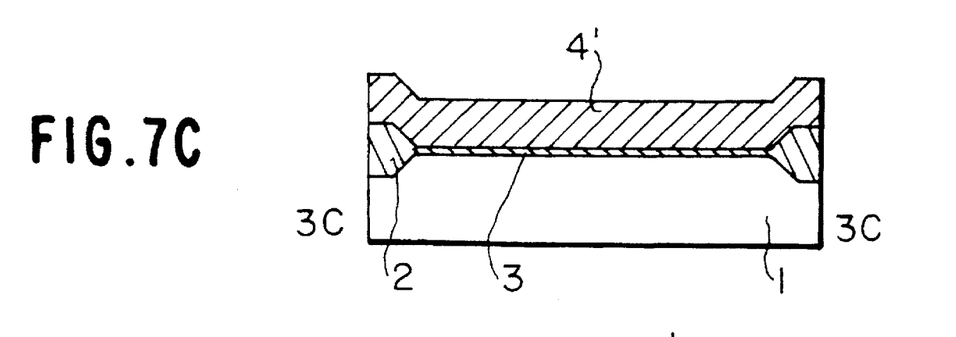
Figure 7D:
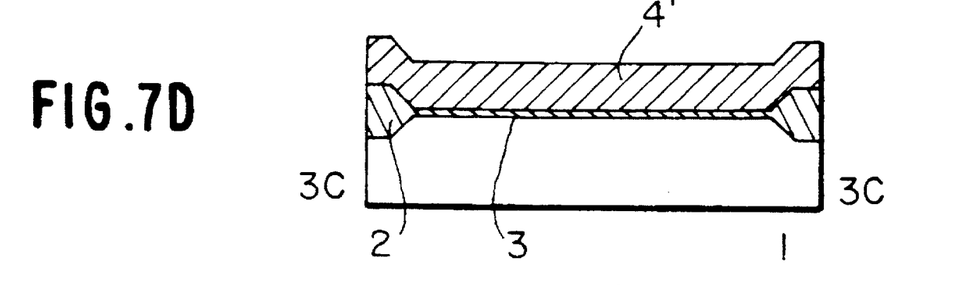

As shown in FIGS. 6A and 7A, a square-shaped peripheral element-isolating insulating film 2 of silicon oxide having a thickness of 500 nm, for example, is formed on the surface of a semiconductor substrate 1 of p-type silicon having an impurity concentration of $1 \times 10^{15}$ cm$^{-3}$ according to an ordinary process. Then, as shown in FIGS. 6B and 7B, a first gate insulating film 3 of oxide silicon having a thickness of 10 nm, for example, is grown on the entire surface of the semiconductor substrate 1. Then, as shown in FIGS. 6C and 7C, a layer 4' of phosphorus-doped polycrystalline silicon having a thickness of 400 nm is grown on the surface formed so far. The layer 4' will be processed into floating gate electrodes 4. The layer 4' is patterned into column-wise strips as shown in FIGS. 6D and 7D. The striped layer 4' is composed of interconnected floating gate electrodes in each column as indicated by the dot-and-dash lines in FIG. 2. The width of the striped layer 4' in each column determines the isolation interval between adjacent source and drain regions 5, 6.

Figure 6E:
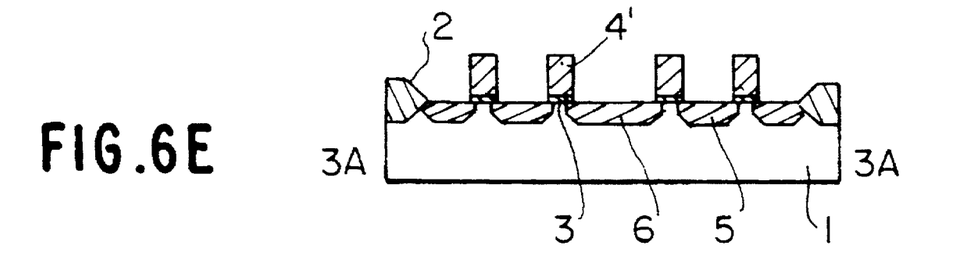
Figure 6F:
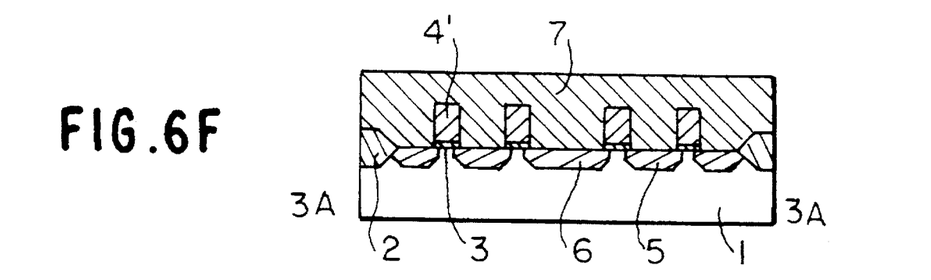
Figure 6G:
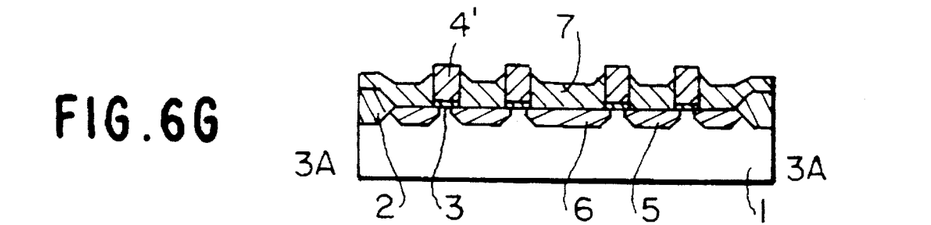
Figure 7E:
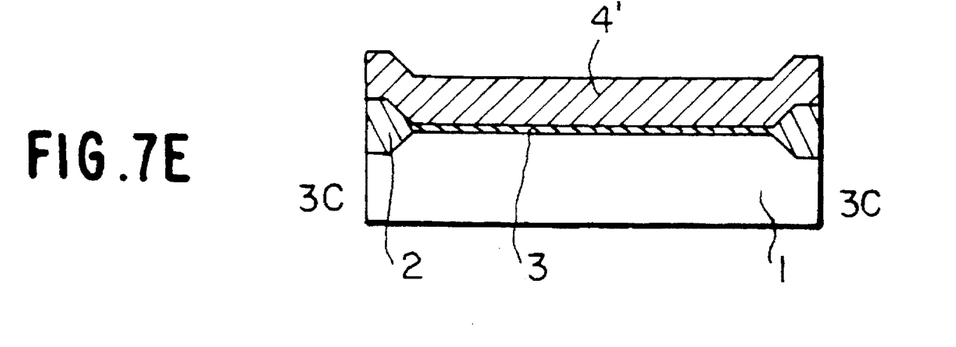
Figure 7F:
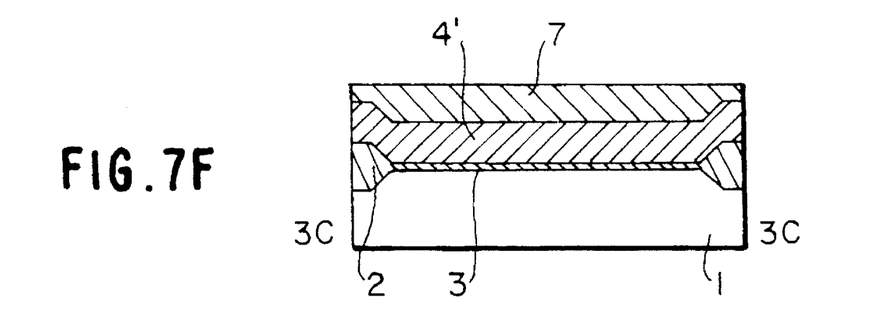
Figure 7G:
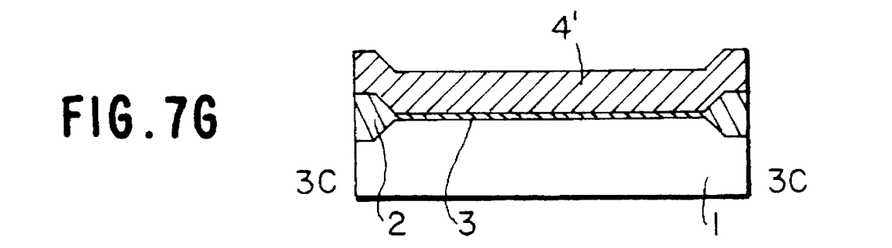

Using the striped layer 4' as a mask, an impurity such as of arsenic is implanted into the semiconductor substrate 1 at an impurity concentration of $5 \times 10^{15}$ cm$^{-2}$ thereby forming source regions 5 and drain regions 6 as shown in FIGS. 6E and 7E. Then, as shown in FIGS. 6F and 7F, a first interlayer insulating film 7 of BPSG (borophosphosilicate glass) having a thickness of 800 nm, for example, is grown in covering relation to the striped layer 4'. The first interlayer insulating film 7 is then etched back to expose upper surfaces of the striped layer 4' as shown in FIGS. 6G and 7G.

Figure 6H:
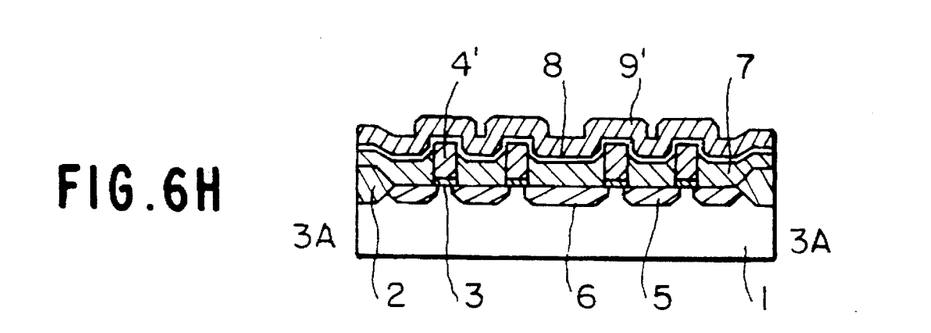
Figure 7H:
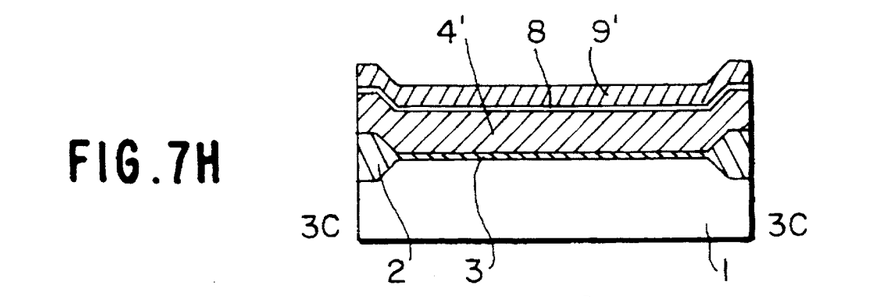

Thereafter, as shown in FIGS. 6H and 7H, a second gate insulating film 8 in the form of a three-layered film which is composed of a layer of silicon oxide having a thickness of 7 nm, a layer of silicon nitride having a thickness of 10 nm, and another layer of silicon oxide having a thickness of 7 nm is formed on the entire exposed surfaces of the striped layer 4' and the first interlayer insulating film 7 by CVD (chemical vapor deposition), for example. Then, a layer 9' composed of a film of phosphorus-doped polycrystalline silicon having a thickness of 150 nm and a film of WSi having a thickness of 150 nm is grown on the second gate insulating film 8. The layer 9' will serve as control gate electrodes 9.

Figure 6I:
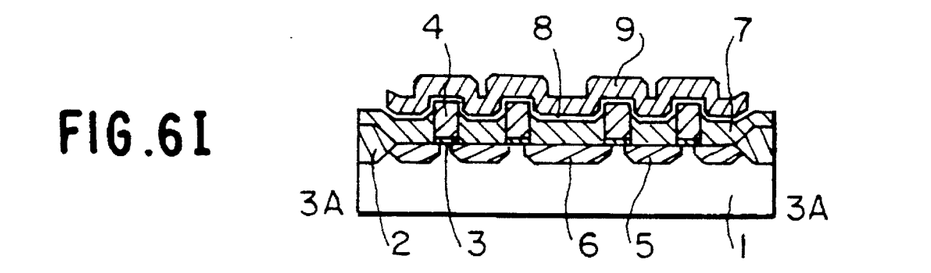
Figure 6J:
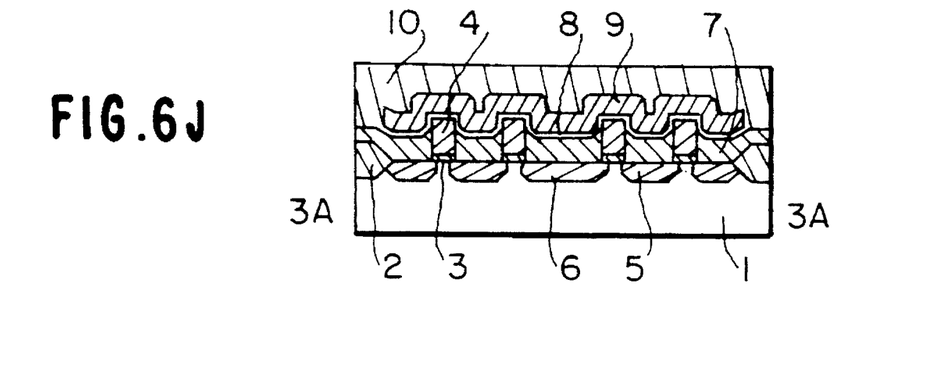
Figure 7I:
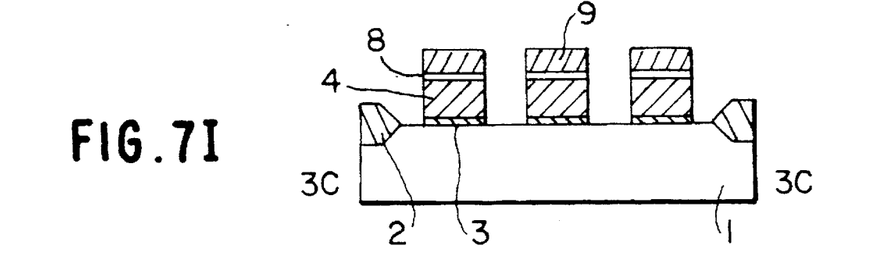
Figure 7J:
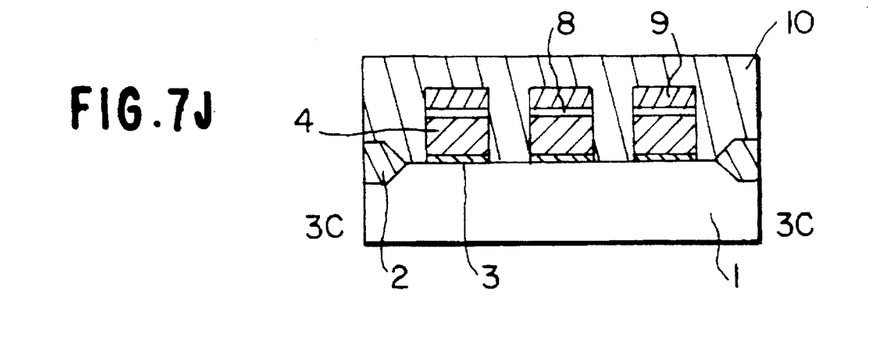

The layer 9' is patterned according to an ordinary process, forming control gate electrodes 9 as shown in FIGS. 6I and 7I. At this time, the second gate insulating film 8 and the striped layer 4' are etched in self-alignment with the control gate electrodes 9 according to an ordinary process, separating floating gate electrodes 4 thereby to complete individual memory cell transistors. Finally, a second interlayer insulating film 10 of BPSG having a thickness of 1 µm, for example, is formed on the surface formed so far, thus perfecting the nonvolatile semiconductor memory device as shown in FIGS. 6J and 7J.

The floating gate electrodes in the nonvolatile semiconductor memory device according to the present invention first are not limited to the above configuration, but may be any of various shapes.

Figure 8:
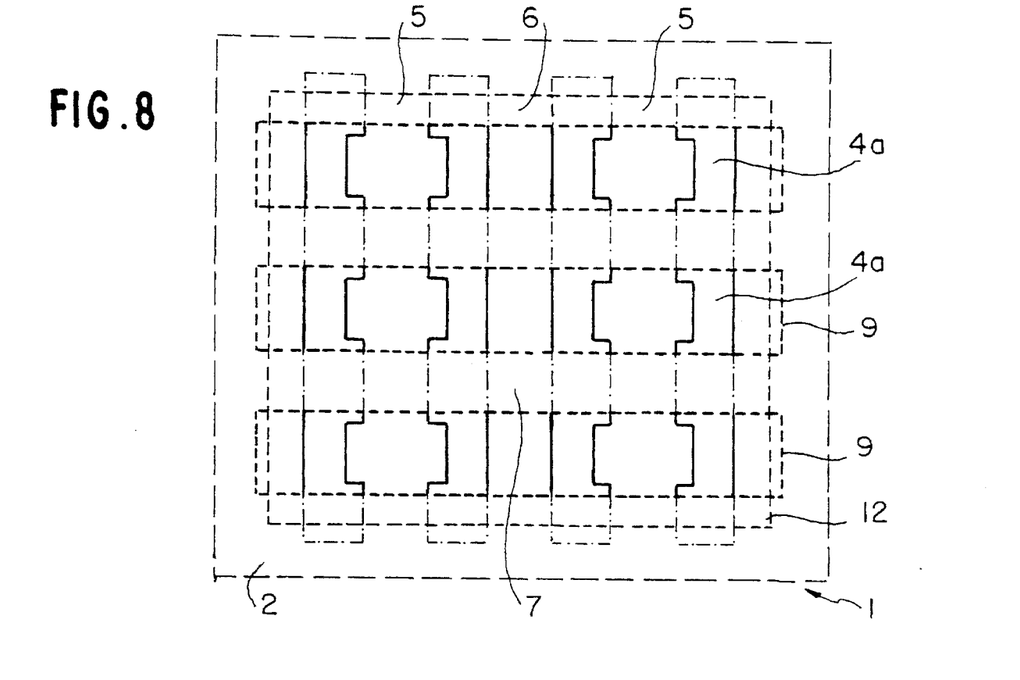
FIG. 8 is a schematic plan view of a nonvolatile semiconductor memory device according to a second embodiment of the present invention.

A nonvolatile semiconductor memory device according to a second embodiment of the present invention will be described below with reference to FIG. 8. The memory device differs from the nonvolatile semiconductor memory device according to the first embodiment with respect to the configuration of floating gate electrodes and hence the configuration of drain and source regions. According to the first embodiment, as shown in FIG. 2, the portions, which have the respective widths $L_R$, $L_W$, of each floating gate electrode 4 are connected to each other by diagonal portions indicated by slant lines, and each floating gate electrode 4 is constricted on the side which faces the drain region 6. According to the second embodiment, as shown in FIG. 8, each floating gate electrode 4a is of such a shape that a small rectangular region is removed from a side thereof which faces the source region 5.

Figure 9:
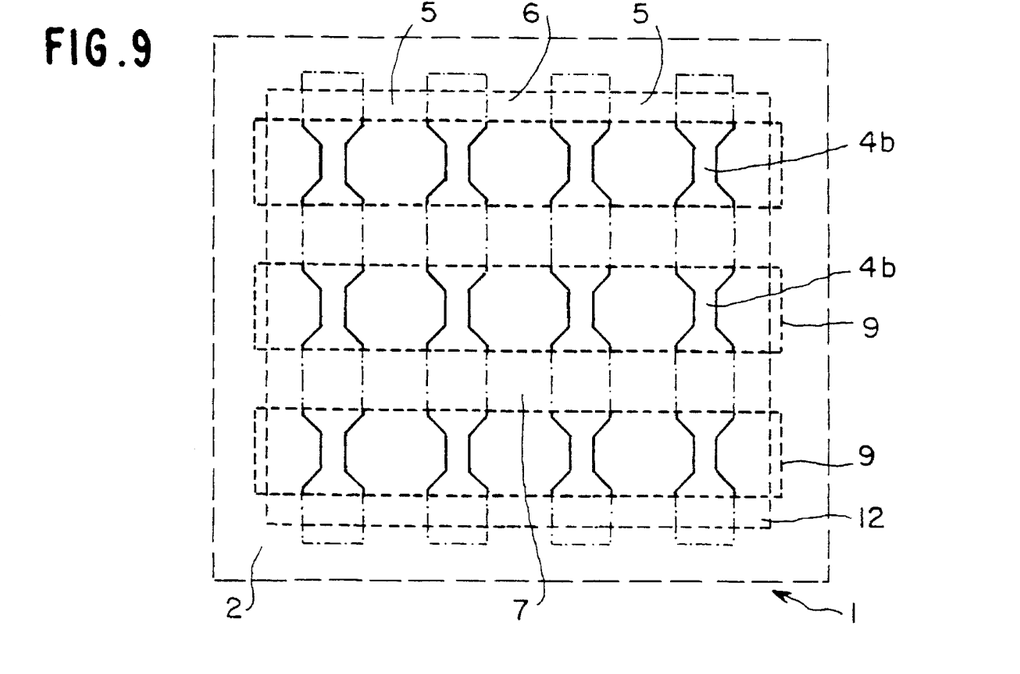
FIG. 9 is a schematic plan view of a nonvolatile semiconductor memory device according to a third embodiment of the present invention.

FIG. 9 shows a nonvolatile semiconductor memory device according to a third embodiment of the present invention. The memory device differs from the nonvolatile semiconductor memory device according to the first embodiment in that each floating gate electrode 4b is constricted in both sides thereof which face the source region 5 and the drain region 6.

Figure 10:
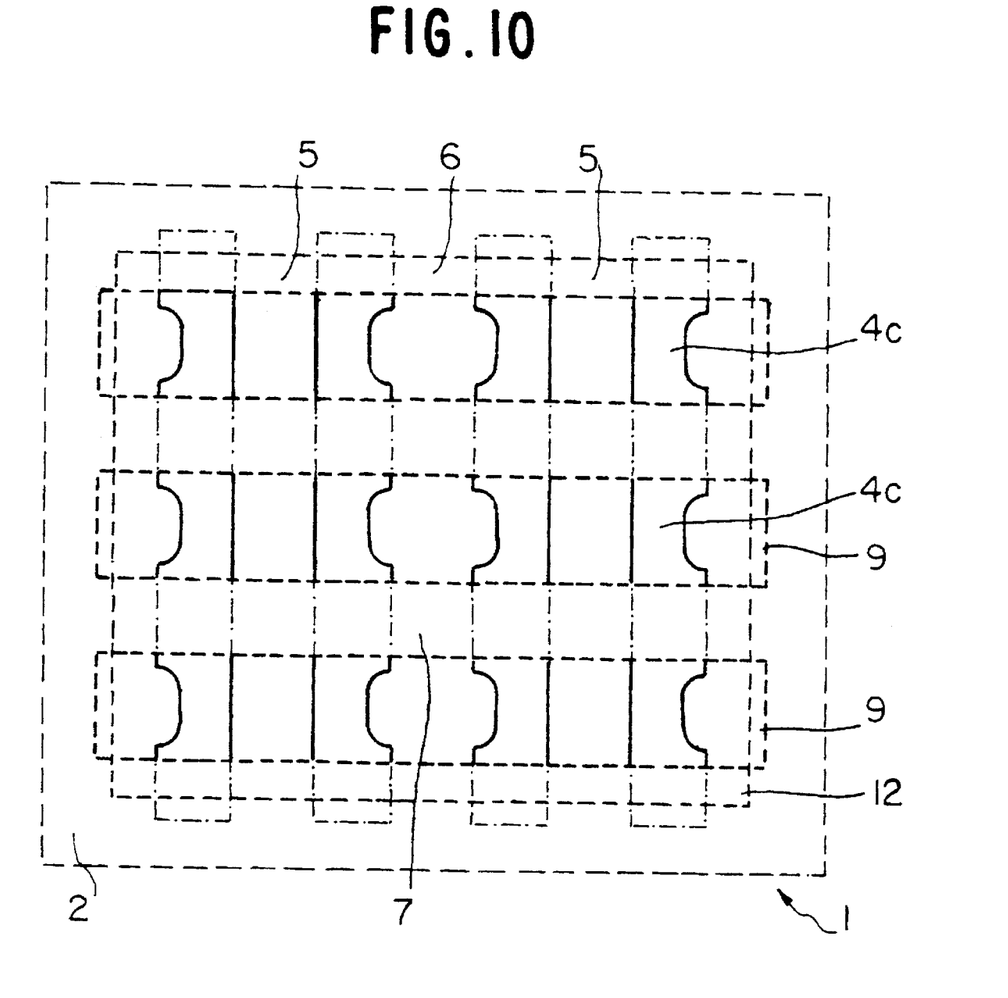
FIG. 10 is a schematic plan view of a nonvolatile semiconductor memory device according to a fourth embodiment of the present invention.

FIG. 10 shows a nonvolatile semiconductor memory device according to a fourth embodiment of the present invention. The memory device differs from the nonvolatile semiconductor memory device according to the first embodiment in that each floating gate electrode 4c is constricted in a round shape.

The nonvolatile semiconductor memory devices according to the second through fourth embodiments of the present invention offers the same advantages as those of the nonvolatile semiconductor memory device according to the first embodiment of the present invention.

It is to be understood, however, that although the characteristics and advantages of the present invention have been set forth in the foregoing description, the disclosure is illustrative only, and changes may be made in the shape, size, and arrangement of the parts within the scope of the appended claims.

What is claimed is:

1. A nonvolatile semiconductor memory device comprising:
   a plurality of memory cell transistors each comprising
      a semiconductor substrate having conductivity,
      source and drain regions disposed on a surface of said substrate,
      a path disposed between said source and drain regions,
      a first gate insulating film covering said path,
      a floating gate electrode disposed on said first gate insulating film,
      a second gate insulating film covering said floating gate electrode, and
      a control gate electrode disposed on said second gate insulating film;
   at least two of said memory cell transistors sharing the same source and drain regions;
   said path includes an element-isolation region having a uniform isolation length, and a channel region having a first channel length, a second channel length, a first channel width, and a second channel width,
      wherein said channel region is directly opposed by said floating gate electrodes,
      wherein said element-isolation region is disposed between a pair of said channel regions, and lacks said floating gate electrode,
      wherein said floating gate electrode is dimensioned to include a first length, a second length, a first width, and a second width,
      wherein said first length is greater than said second length as to create smaller said second width relative to said first width, and
      wherein said second length is substantially constant over said second width, and
      wherein said first and second widths correspond to, and extend in the same direction as, said first and second channel widths, respectively, and said first and second lengths correspond to, and extend in the same direction as, said first and second channel lengths, respectively.

2. The nonvolatile semiconductor memory device according to claim 1, wherein said floating gate electrode is of a rectangular shape recessed at one side or two sides thereof, said one side or said two sides facing said source region or said drain region.

3. The nonvolatile semiconductor memory device according to claim 1, wherein said floating gate electrode is of a shape of a first rectangle recessed at a side thereof in a pattern of a second rectangle smaller than said first rectangle, said side facing said source region or said drain region.

4. The nonvolatile semiconductor memory device according to claim 1, wherein said floating gate electrode is of a rectangular shape recessed at a side thereof in a pattern of a trapezoidal shape, said side facing said source region or said drain region.

5. The nonvolatile semiconductor memory device according to claim 1, wherein said semiconductor substrate comprises a silicon substrate.

6. The nonvolatile semiconductor memory device according to claim 5, wherein each of said gate insulating films comprises a silicon oxide film.

7. The nonvolatile semiconductor memory device according to claim 1, wherein said floating gate electrode comprises polycrystalline silicon.

8. The nonvolatile semiconductor memory device according to claim 1, wherein said memory cell transistors are arranged in an array of rows and columns, and wherein the control gate electrodes of those memory cell transistors which belong to the same row are of an integral structure, and those memory cell transistors which belong to the same column share the same source region and the same drain region.

9. The nonvolatile semiconductor memory device according to claim 8, wherein said floating gate electrode is of a rectangular shape recessed at one side or two sides thereof, said one side or said two sides facing said source region or said drain region.

10. The nonvolatile semiconductor memory device according to claim 8, wherein said floating gate electrode is of a shape of a first rectangle recessed at a side thereof in a pattern of a second rectangle smaller than said first rectangle, said side facing said source region or said drain region.

11. The nonvolatile semiconductor memory device according to claim 8, wherein said floating gate electrode is of a rectangular shape recessed at a side thereof in a pattern of a trapezoidal shape, said side facing said source region or said drain region.

12. The nonvolatile semiconductor memory device according to claim 8, wherein said semiconductor substrate comprises a silicon substrate.

13. The nonvolatile semiconductor memory device according to claim 12, wherein each of said gate insulating films comprises a silicon oxide film.

14. The nonvolatile semiconductor memory device according to claim 8, wherein said floating gate electrode comprises polycrystalline silicon.

* * * * *